United States Patent
Lee et al.

(10) Patent No.: US 9,356,427 B2
(45) Date of Patent: May 31, 2016

(54) MULTI-WAVELENGTH SURFACE PLASMON LASER AND OPTOELECTRONIC INTEGRATED CIRCUIT INCLUDING THE SAME

(71) Applicant: SAMSUNG ELECTRONICS CO., LTD., Suwon-si (KR)

(72) Inventors: Jaesoong Lee, Suwon-si (KR); Jineun Kim, Suwon-si (KR); Yeonsang Park, Suwon-si (KR); Changwon Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/513,477

(22) Filed: Oct. 14, 2014

(65) Prior Publication Data

US 2015/0280401 A1      Oct. 1, 2015

(30) Foreign Application Priority Data

Mar. 28, 2014  (KR) .................. 10-2014-0037241

(51) Int. Cl.
*H01S 3/08*  (2006.01)
*H01S 5/10*  (2006.01)
*H01S 5/343*  (2006.01)
*H01S 3/086*  (2006.01)

(52) U.S. Cl.
CPC ............... *H01S 5/1046* (2013.01); *H01S 3/086* (2013.01); *H01S 5/106* (2013.01); *H01S 5/1067* (2013.01); *H01S 5/343* (2013.01)

(58) Field of Classification Search
CPC ....... H01S 5/1046; H01S 3/086; H01S 5/106; H01S 5/1067; H01S 5/343
See application file for complete search history.

(56) References Cited

U.S. PATENT DOCUMENTS

| | | | |
|---|---|---|---|
| 8,144,742 B2 | 3/2012 | Shimizu et al. | |
| 8,472,771 B2 | 6/2013 | Karalis et al. | |
| 8,509,276 B2 | 8/2013 | Zhang et al. | |
| 2003/0179974 A1* | 9/2003 | Estes ...................... | B82Y 20/00 385/2 |
| 2008/0316490 A1* | 12/2008 | Yen ....................... | G01N 21/554 356/445 |
| 2010/0002739 A1 | 1/2010 | Hu et al. | |
| 2012/0063478 A1* | 3/2012 | Park ..................... | H01S 5/1046 372/39 |
| 2012/0081703 A1 | 4/2012 | Moskovits et al. | |
| 2013/0070799 A1 | 3/2013 | Lee et al. | |
| 2013/0148682 A1* | 6/2013 | Zhang .................. | H01S 5/1046 372/45.01 |
| 2015/0188280 A1* | 7/2015 | Hill ...................... | H01S 5/1046 372/7 |

* cited by examiner

*Primary Examiner* — Yuanda Zhang
(74) *Attorney, Agent, or Firm* — Sughrue Mion, PLLC

(57) ABSTRACT

A multi-wavelength surface plasmon laser that simultaneously emits surface plasmons having a large number of wavelengths and includes an active layer whose thickness changes with position, and a metal cavity whose length changes with position so that light of different wavelengths is emitted according to position. Surface plasmons are generated at the interface between a metal layer and a semiconductor layer in response to the light of different wavelengths. The surface plasmons having different wavelengths may be resonated in the metal cavity whose length changes with position and may be emitted to the outside.

19 Claims, 6 Drawing Sheets

200

300

600

700

700

800

MULTI-WAVELENGTH SURFACE PLASMON LASER AND OPTOELECTRONIC INTEGRATED CIRCUIT INCLUDING THE SAME

RELATED APPLICATION

This application claims priority from Korean Patent Application No. 10-2014-0037241, filed on Mar. 28, 2014, in the Korean Intellectual Property Office, the disclosure of which is incorporated by reference herein in its entirety.

BACKGROUND

1. Field

The exemplary embodiments relate to a surface plasmon laser and a circuit including the same. In particular, exemplary embodiments relate to a multi-wavelength surface plasmon laser with a simple structure that simultaneously emits surface plasmons having a large number of wavelengths, and an optoelectronic integrated circuit including the multi-wavelength surface plasmon laser.

2. Description of the Related Art

An optoelectronic integrated circuit of the related art is formed by integrating on one substrate a variety of optical devices and electronic devices that perform a variety of operations such as light emission, photodetection, light amplification, light modulation. Such an optoelectronic integrated circuit of the related art may be applied to various devices, for example, optical recording/reproducing devices, optical communication devices, display devices, optical computers, and the like.

A laser may be used as a light source for the optoelectronic integrated circuit. Many different types of lasers have been developed and used according to output power, oscillation wavelength, and oscillation methods. In order to raise the degree of integration of the optoelectronic integrated circuit, the size of a light spot of a laser beam emitted from a laser needs to be very small (for example, no more than 1 µm), and the size of a laser device itself has to be downsized.

A laser that may meet these conditions is, for example, a surface plasmon laser. The surface plasmon laser has light-focusing properties in a sub-micron range, and may be minutely manufactured through a common semiconductor process. Accordingly, attempts have been made to use a surface plasmon laser as a light source for an optoelectronic integrated circuit.

SUMMARY

Additional aspects will be set forth in part in the description which follows and, in part, will be apparent from the description, or may be learned by practice of the exemplary embodiments.

According to an aspect of an exemplary embodiment, a surface plasmon laser may include a metal layer; a semiconductor layer that is disposed on an upper surface of the metal layer and includes an active layer whose thickness changes along a first direction parallel to the upper surface of the metal layer; and a first reflector and a second reflector that protrude from the upper surface of the metal layer, are extended from the upper surface of the metal layer, and are respectively disposed opposite a front and a back of the semiconductor layer. Here, the first reflector and the second reflector may form a resonant cavity for surface plasmons generated at an interface between the metal layer and the semiconductor layer, and a length of a resonant cavity may change along the first direction.

The length of the resonant cavity may change with the thickness change of the active layer along the first direction.

The length of the resonant cavity is determined by an interval between the first reflector and the second reflector along a second direction which is perpendicular to the first direction, and the interval between the first reflector and the second reflector may change along the first direction.

The thickness of the active layer may continuously change along the first direction.

Or, the thickness of the active layer may discretely change in a plurality of step portions along the first direction.

The active layer may include a plurality of regions whose thicknesses are different from each other and are spaced apart from each other.

Each of the plurality of regions of the active layer may have a plurality of quantum dots, a plurality of diameters of the quantum dots disposed in each respective region may be substantially equal, and the diameters of quantum dots disposed in each respective region may be different from a plurality of diameters of quantum dots disposed in other regions of the region.

Also, the thickness of the active layer and the length of the resonant cavity may change symmetrically.

The semiconductor layer may include a first clad layer disposed on the metal layer; the active layer disposed on the first clad layer; and a second clad layer disposed on the active layer.

At least a portion of the first clad layer may be buried in the metal layer.

The surface plasmon laser may further include an electrode layer disposed on the second clad layer, and an insulating layer disposed at least partially around the second clad layer to prevent the metal layer from electrically contacting the second clad layer.

The length of the resonant cavity may continuously change along the first direction.

The first reflector and the second reflector may form a flat surface, and the first reflector and the second reflector may not be parallel to each other so that an interval between the first reflector and the second reflector may continuously change.

At least one of the first reflector and the second reflector may be disposed in a slant toward the front or the back of the semiconductor layer.

The length of the resonant cavity may discretely change in a plurality of step portions along the first direction.

At least one of the first reflector and the second reflector may have a plurality of bent step portions.

At least one of the first reflector and the second reflector may include a plurality of vertical reflective films that are parallel to each other.

The surface plasmon laser may further include a transparent cover layer covering the upper surface of the metal layer and the semiconductor layer.

According to another aspect of an exemplary embodiment, an optoelectronic integrated circuit may include the surface plasmon laser having the above-described structure.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION OF EXEMPLARY EMBODIMENTS

Figure 1:
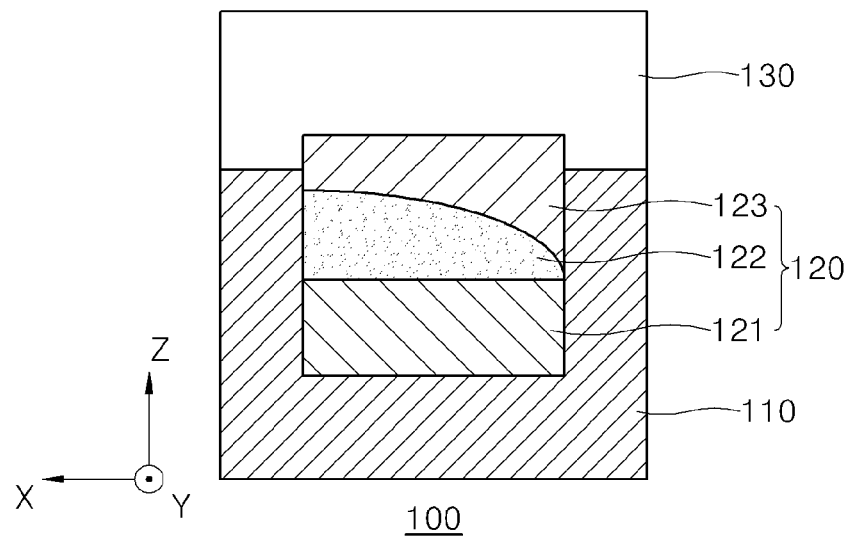
FIG. 1 is a cross-sectional front view schematically showing a structure of a multi-wavelength surface plasmon laser according to an exemplary embodiment.

Reference will now be made in detail to embodiments, examples of which are illustrated in the accompanying drawings, wherein like reference numerals refer to like elements throughout. In this regard, the exemplary embodiments may have different forms and should not be construed as being limited to the descriptions set forth herein. Accordingly, the exemplary embodiments are merely described below, by referring to the figures, to explain aspects of the present description. Also, if a positional relationship between two items is described with the terms "on ~," "on the top of ~," or the like, one or more items may be interposed therebetween unless a description is given without the term "directly."

As used herein, expressions such as "at least one of," when preceding a list of elements, modify the entire list of elements and do not modify the individual elements of the list.

FIG. 1 is a cross-sectional front view schematically showing a structure of a multi-wavelength surface plasmon laser 100 according to an exemplary embodiment. The cross-sectional front view of FIG. 1 illustrates, for example, the multi-wavelength surface plasmon laser 100 seen from the direction of y-axis. The z-axis denotes thickness, and the x-axis denotes a side surface. Referring to FIG. 1, the multi-wavelength surface plasmon laser 100 according to the exemplary embodiment may include a metal layer 110, a semiconductor layer 120 disposed on an upper surface of the metal layer 110, and a cover layer 130 covering the metal layer 110 and the semiconductor layer 120. As illustrated in FIG. 1, the upper surface of the metal layer 110 is parallel to the x-axis and y-axis and perpendicular to the z-axis.

The metal layer 110 causes surface plasmon resonance at the interface formed with semiconductor layer 120. In order to cause the surface plasmon resonance, the metal layer 110 may be formed of a material that easily causes the surface plasmon resonance, for example, silver (Ag) or gold (Au). Besides these materials, a conductive metal such as copper (Cu), lead (Pb), indium (In), tin (Sn), and cadmium (Cd) may be used as the metal layer 110. As illustrated in FIG. 1, a portion of the metal layer 110 may be extended so as to enclose at least a portion of a side surface of the semiconductor layer 120.

The semiconductor layer 120 is optically or electrically pumped, emits light, and transmits the light to the metal layer 110. To perform these functions, the semiconductor layer 120 may include a first clad layer 121 disposed on the metal layer 110, an active layer 122 disposed on the first clad layer 121, and a second clad layer 123 disposed on the active layer 122. The first clad layer 121 and the second clad layer 123 provide electrons and holes to the active layer 122, and act as a barrier layer so as to confine the electrons and the holes in the active layer 122. The active layer 122 acts as a quantum well to recombine the electrons and the holes and to generate light. As the active layer 122, a semiconductor material, for example, indium phosphide (InP), indium gallium nitride (InGaN), gallium arsenide (GaAs), indium gallium arsenide (InGaAs), indium gallium aluminum arsenide (InGaAlAs), indium gallium arsenide phosphide (InGaAsP), and the like, may be used. A semiconductor material, for example, gallium nitride (GaN), indium gallium arsenide phosphide (InGaAsP), aluminium gallium arsenide (AlGaAs), indium gallium aluminum arsenide (InGaAlAs), indium gallium arsenide phosphide (InGaAsP), and the like may be used to form the first clad layer 121 and the second clad layer 123. For example, the semiconductor layer 120 may be formed of a combination of the above-described material such that an energy level of the first clad layer 121 and the second clad layer 123 is higher than that of the active layer 122.

The cover layer 130 protects the metal layer 110 and the semiconductor layer 120. If the semiconductor layer 120 is to be optically pumped, the cover layer 130 may be formed of a transparent material such as glass or polymethyl methacrylate (PMMA) in order that light for pumping may be provided to the semiconductor layer 120.

According to the exemplary embodiment, in order for the active layer 122 to simultaneously emit lights of different wavelengths, a thickness of the active layer 122 may change with position, as illustrated in FIG. 1. For example, referring to FIG. 1, the thickness of the active layer 122 gradually decreases from left to right along the direction of the x-axis. In other words, the thickness of a left end portion of the active layer 122 may be the largest, and the thickness of a right end portion of the active layer 122 may be close to 0. FIG. 1 illustrates an example of changes of the thickness of the active layer 122, but the exemplary embodiment is not limited to the structure illustrated in FIG. 1. For example, the thickness of the active layer 122 may gradually decrease in a direction from right to left. Also, the difference in the thickness between the left and right portions of the active layer 122 may be selected according to a wavelength of light to be emitted, and the thickness of the thinnest portion does not always need to be close to 0.

In the above-described structure, since photon energy changes with the thickness of the active layer 122, lights of different wavelengths may be emitted according to the thickness of the active layer 122. For example, as illustrated in FIG.

1, if the thickness of the active layer 122 continually changes, lights of continuous wavelengths may be emitted from the active layer 122.

The light emitted as described above is provided to the metal layer 110, and then generates surface plasmons at the interface between the metal layer 110 and the semiconductor layer 120, e.g., between the metal layer 110 and the first clad layer 121. The surface plasmons are surface electromagnetic waves that exist at the interface between metal and a dielectric. The surface plasmons are generated by charge density oscillation caused on a surface of metal when light of a particular wavelength is incident on the metal. The surface plasmons are evanescent waves that are very strong and whose effective distance is short, and may propagate along a surface of metal. The wavelength of the surface plasmons may vary according to the wavelength of light incident on metal, a material of metal, and a refractive index of a dielectric. Accordingly, the surface plasmons, which have a variety of wavelengths according to a variety of wavelengths of light that is incident on the metal layer 110, may be generated at the interface between the metal layer 110 and the first clad layer 121. The multi-wavelength surface plasmon laser 100 according to the exemplary embodiment may amplify surface plasmons having a desired wavelength by resonating the surface plasmons in a resonant cavity and output them to the outside.

Figure 2:
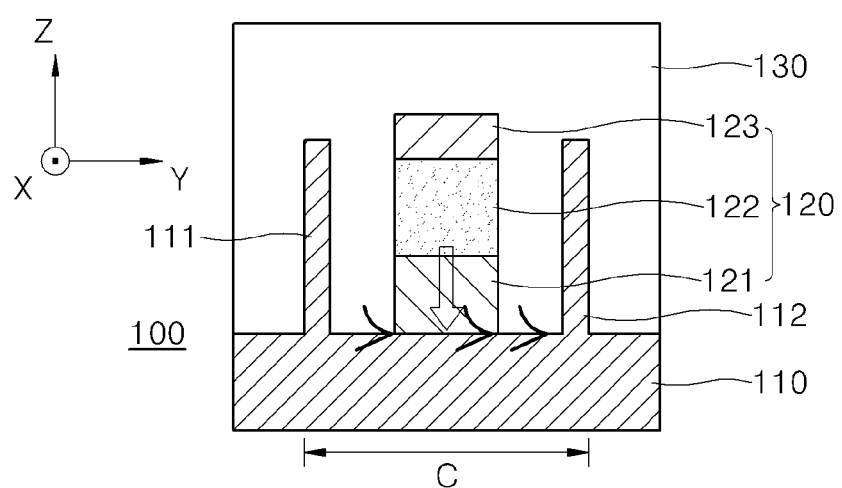
FIG. 2 is a vertical sectional side view schematically showing a structure of a resonant cavity of the multi-wavelength surface plasmon laser illustrated in FIG. 1.

FIG. 2 is a vertical sectional side view schematically showing a structure of the resonant cavity of the multi-wavelength surface plasmon laser 100 illustrated in FIG. 1. The vertical sectional side view of FIG. 2 illustrates the multi-wavelength surface plasmon laser 100 seen from the direction of the x-axis. The z-axis denotes thickness, and the y-axis denotes a frontal direction. Referring to FIG. 2, the multi-wavelength surface plasmon laser 100 according to the exemplary embodiment may further include a first reflector 111 and a second reflector 112 that are respectively disposed in front of and at the back of the semiconductor layer 120. The first reflector 111 and the second reflector 112, which protrude from and are extended perpendicularly to an upper surface of the metal layer 110, may be formed of the same material as that of the metal layer 110. The first reflector 111 and the second reflector 112 form a resonant cavity C for the surface plasmons generated at the interface between the metal layer 110 and the semiconductor layer 120. Accordingly, the surface plasmons may resonate by being repeatedly reflected between the first reflector 111 and the second reflector 112. As a result, from among the surface plasmons that have a variety of wavelengths, surface plasmons that have a certain wavelength satisfying a resonance condition may be output from the multi-wavelength surface plasmon laser 100.

Figure 3:
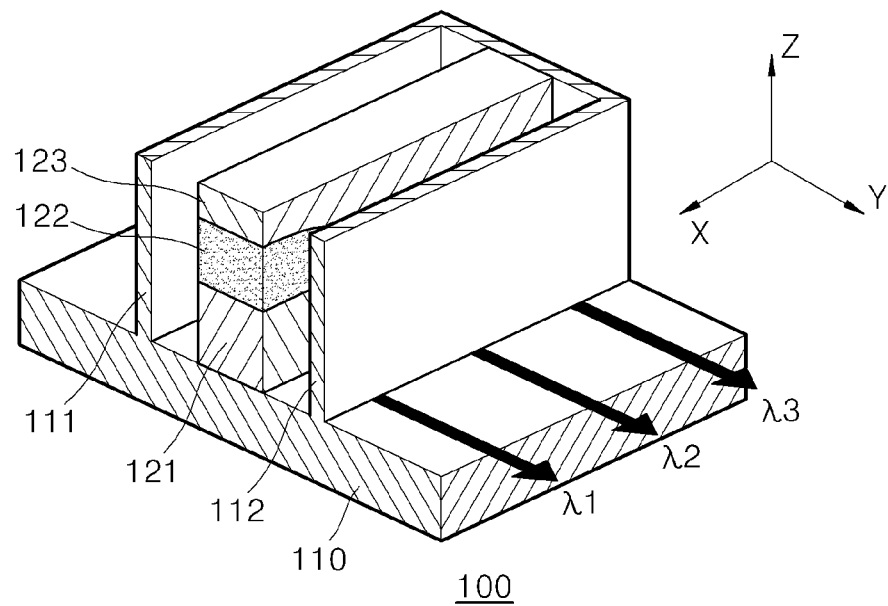
FIG. 3 is a cross-sectional perspective view schematically showing a structure of the multi-wavelength surface plasmon laser illustrated in FIG. 1.

FIG. 3 is a cross-sectional perspective view schematically showing a structure of the multi-wavelength surface plasmon laser 100 illustrated in FIG. 1. In FIG. 3, in order to show a structure of the semiconductor layer 120, a portion of the metal layer 110 enclosing a left side of the semiconductor layer 120 is cut. Referring to FIG. 3, portions of the surface plasmons resonating between the first reflector 111 and the second reflector 112 may pass through the second reflector 112 and be output along an external surface of the metal layer 110. As illustrated in FIG. 3, the output surface plasmons may propagate along the direction of the y-axis. Also, since the thickness of the active layer 122 changes along the direction of the x-axis, surface plasmons that have different wavelengths λ1, λ2, and λ3 along the direction of the x-axis may be output in the direction of the y-axis, respectively. In FIG. 3, the surface plasmons that have three wavelengths λ1, λ2, and λ3, are illustrated. However, the number and the length of the wavelengths of the output surface plasmons may be variously selected according to a resonance condition.

The resonance condition may be adjusted by a length of the resonant cavity C. The length of the resonant cavity C may be defined as an interval between the first reflector 111 and the second reflector 112 along the direction of the y-axis. For example, by considering continuous wavelength changes of the surface plasmons along the direction of the x-axis, the length of the resonant cavity C may be changed with a position in the direction of the x-axis, so that surface plasmons having a desired wavelength may be output. In other words, the length of the resonant cavity C also may be changed along the direction of the x-axis in response to the thickness change of the active layer 122 along the direction of the x-axis.

Figure 4:
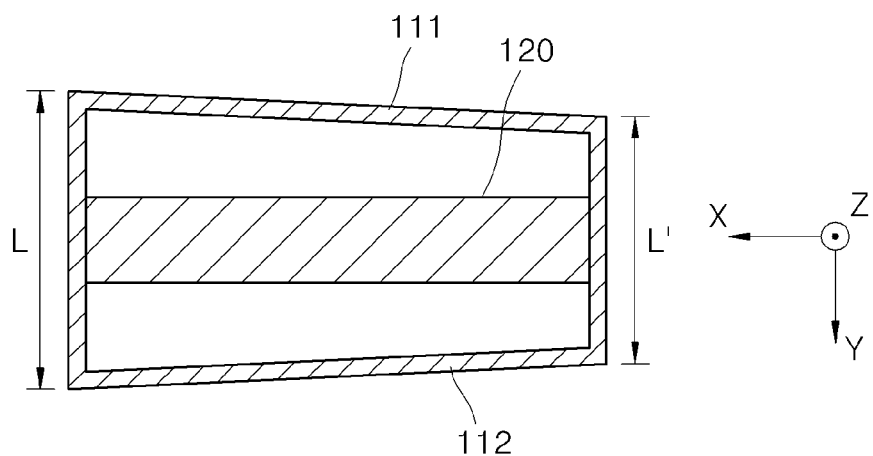
FIG. 4 is a transverse cross-sectional view showing the structure of the resonant cavity of the multi-wavelength surface plasmon laser illustrated in FIG. 1.

FIG. 4 is a transverse cross-sectional view showing the structure of the resonant cavity of the multi-wavelength surface plasmon laser 100 illustrated in FIG. 1. In FIG. 4, the length of the resonant cavity C continuously changes along the direction of the x-axis. As illustrated in FIG. 4, the first reflector 111 and the second reflector 112 may be respectively formed in the form of a slab, and may be disposed to be not parallel to each other so that the length of the resonant cavity C may continuously change. For example, both of the first reflector 111 and the second reflector 112 may be disposed in a slant toward the front and the back of the semiconductor layer 120. Alternatively, only one of the first reflector 111 and the second reflector 112 may be disposed in a slant toward the front and the back of the semiconductor layer 120, and the other one may be disposed parallel to the front and the back of the semiconductor layer 120.

The interval between the first reflector 111 and the second reflector 112 continuously changes along the direction of the x-axis. Thus, the length of the resonant cavity C may continuously change along the direction of the x-axis. Accordingly, since the resonant condition changes along the direction of the x-axis, surface plasmons having different wavelengths along the direction of the x-axis may be output. In FIG. 4, it is exemplary illustrated that a left length L of the resonant cavity C is bigger that a right length L' of the resonant cavity C, but the present embodiment is not limited thereto. Also, in FIG. 4, the change of the length of the resonant cavity C is exaggerated to some extent. In fact, the difference between the left length L and the right length L' of the resonant cavity C may be very small according to output wavelengths of surface plasmons.

According to the present embodiment described above, because the active layer 122, whose thickness changes with position, and the resonant cavity C, whose length changes with position, are used, the multi-wavelength surface plasmon laser 100 may be easily manufactured to simultaneously emit surface plasmons having a variety of wavelengths, The multi-wavelength surface plasmon laser 100 may be used as a light source for optoelectronic integrated circuits, for example, optical interconnect structures using lights having a plurality of wavelengths, 3D hologram devices, and the like. In this case, a structure of the optoelectronic integrated circuit may be simplified.

Figure 5:
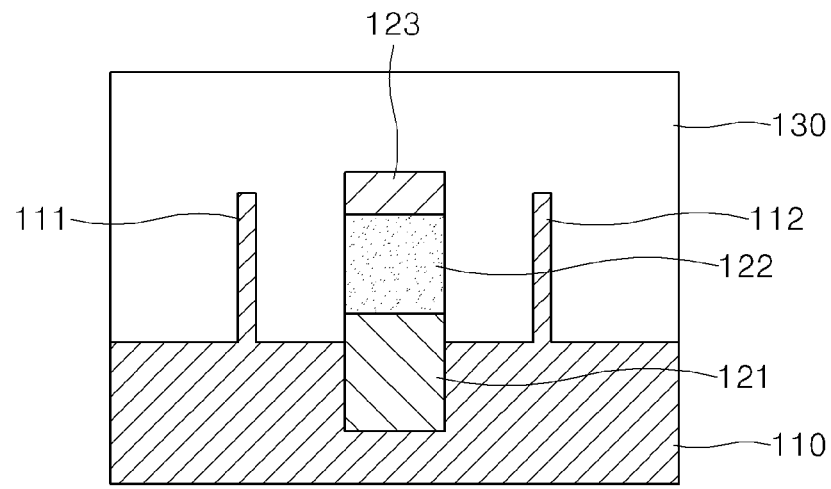
FIG. 5 is a vertical sectional side view schematically showing a structure of a multi-wavelength surface plasmon laser according to an exemplary embodiment.

FIG. 5 is a vertical sectional side view schematically showing a structure of a multi-wavelength surface plasmon laser 200 according to an embodiment. According to FIG. 2, the semiconductor layer 120 is disposed on an upper surface of the metal layer 110 that is flat. However, as illustrated in FIG. 5, at least a portion of the first clad layer 121 may be buried in the metal layer 110. For this purpose, a groove to accommodate the first clad layer 121 may be formed in an upper portion of the metal layer 110. In the case of the multi-wavelength surface plasmon laser 200 illustrated in FIG. 5, by placing the active layer 122 and the metal layer 100 closer to each other, a loss of light caused when light emitted from the active layer 122 arrives at the metal layer 110 may be reduced, and it is easy to form the first clad layer 121 having a desired thickness.

Figure 6:
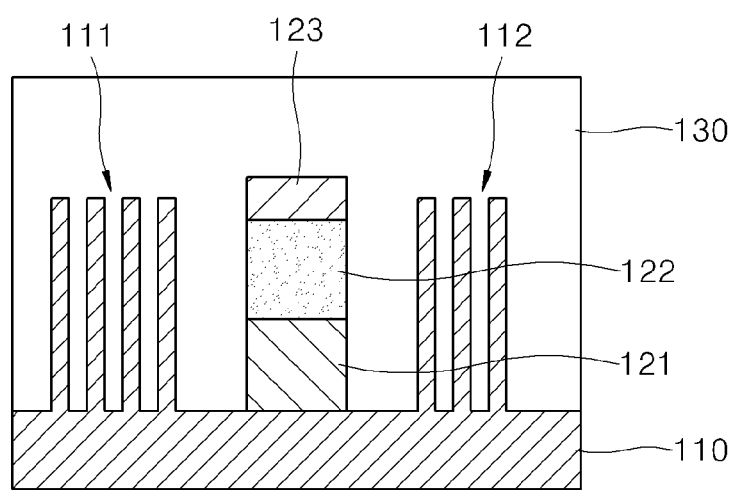
FIG. 6 is a vertical sectional side view schematically showing a structure of a multi-wavelength surface plasmon laser according to another exemplary embodiment.

FIG. 6 is a vertical sectional side view schematically showing a structure of a multi-wavelength surface plasmon laser 300 according to another embodiment. In the embodiment illustrated in FIG. 2, each of the first reflector 111 and the second reflector 112 is formed as one reflective film. However, as illustrated in FIG. 6, the first reflector 111 and the second reflector 112 may respectively include a plurality of vertical reflective films. The plurality of reflective films of the first reflector 111 may be disposed to be parallel to one another, and the plurality of reflective films of the second reflector 112 may be disposed to be parallel to one another. Also, in order to adjust the length of the resonant cavity C, the plurality of reflective films of the first reflector 111 and the plurality of reflective films of the second reflector 112 may be non-parallel to one another. In FIG. 6, it is exemplarily illustrated that the first reflector 111 includes four r reflective films and the second reflector 112 includes three reflective films, but the present embodiment is not limited thereto. For example, the first reflector 111 and the second reflector 112 may respectively have the same number of reflective films. Also, any one of the first reflector 111 and the second reflector 112 may have a plurality of reflective films.

In the embodiment illustrated in FIG. 6, the plurality of reflective films may be disposed so that surface plasmons reflected from each of the reflective films may produce constructive interference with surface plasmons reflected from another reflective film. For example, the optical distance between two neighboring reflective films and the optical thickness of each of the reflective films may be about $\lambda/4$ of a wavelength of output surface plasmons. Thus, the output power of surface plasmons may be increased by increasing the reflectivity of the first reflector 111 and the second reflector 112.

Figure 7:
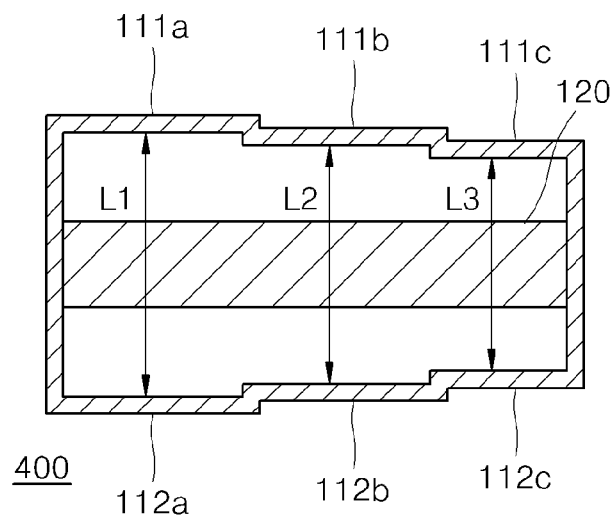
FIG. 7 is a transverse cross-sectional view showing a structure of a resonant cavity of a multi-wavelength surface plasmon laser according to an exemplary embodiment.

FIG. 7 is a transverse cross-sectional view showing a structure of a resonant cavity of a multi-wavelength surface plasmon laser 400 according to an embodiment. In the embodiment illustrated in FIG. 4, the length of the resonant cavity C continuously changes along the direction of the x-axis. However, in the embodiment illustrated in FIG. 7, the length of the resonant cavity C may discretely change in a stepwise manner. Therefore, the first reflector 111 and the second reflector 112 may respectively include a plurality of regions 111a, 111b, and 111c, and a plurality of regions 112a, 112b, and 112c whose intervals are different from one another. In this case, the first reflector 111 and the second reflector 112 may be disposed parallel to each other. For example, the first region 111a of the first reflector 111 and the first region 112a of the second reflector 112 may be disposed in parallel and opposite to each other. The second region 111b of the first reflector 111 and the second region 112b of the second reflector 112 may be disposed in parallel and opposite to each other. The third region 111c of the first reflector 111 and the third region 112c of the second reflector 112 may be disposed in parallel and opposite to each other.

Intervals L1, L2, and L3 between the first through third regions 111a, 111b, and 111c of the first reflector 111 and the first through third regions 112a 112b, and 112c which are respectively opposite the regions of the first reflector 111 may discretely change in stepwise manner along the direction of x-axis. In FIG. 7, it is illustrated that the first reflector 111 and the second reflector 112 are respectively formed in a stepwise manner having regions 111a, 111b, and 111c and regions 112a, 112b, and 112c, but the present embodiment is not limited thereto. For example, the number of regions of the first reflector 111 and the second reflector 112 which have a stepwise form, i.e., regions 111a, 111b, 111c, 112a, 112b, and 112c, may be selected so as to match with the number of wavelengths of output surface plasmons. Also, in FIG. 7, it is exemplary illustrated that both the first reflector 111 and the second reflector 112 are formed in the stepwise manner, i.e., regions 111a, 111b, 111c, 112a, 112b, and 112c. However, any one of the first reflector 111 and the second reflector 112 may form a flat surface without bending, and the other ones may have a plurality of regions that are bent in a stepwise manner.

Figure 8:
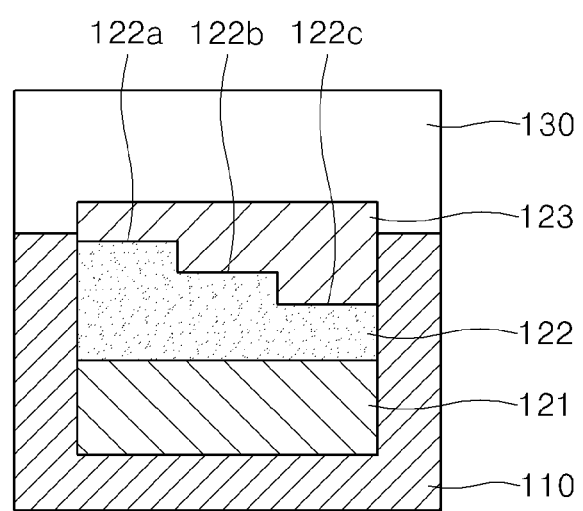
FIG. 8 is a cross-sectional front view schematically showing a structure of a multi-wavelength surface plasmon laser according to an exemplary embodiment.

FIG. 8 is a cross-sectional front view schematically showing a structure of a multi-wavelength surface plasmon laser 500 according to an embodiment. In the embodiment illustrated in FIG. 1, a thickness of the active layer 122 changes gradually along the direction of the x-axis. However, in the embodiment illustrated in FIG. 8, the thickness of the active layer 122 may change along the direction of the x-axis in a stepwise manner. For example, the active layer 122 may include a plurality of regions 122a, 122b, and 122c whose thicknesses are different from one another. Different wavelengths of light may be emitted from the plurality of regions 122a, 122b, and 122c whose thicknesses are different from one another, and lights emitted from one of regions 122a, 122b, and 122c may have the same wavelength. In FIG. 8, the active layer 122 has three regions 122a, 122b, and 122c whose thicknesses are different from one another. However, this is just an example, and the present embodiment is not limited thereto. For example, the number of regions of the active layer 122 and each thickness of the regions may be determined according to the number of wavelengths of surface plasmons to be output.

Figure 9:
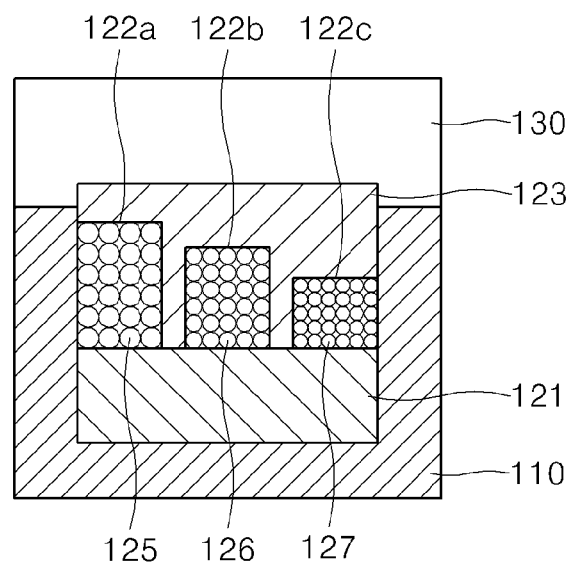
FIG. 9 is a cross-sectional front view schematically showing a structure of a multi-wavelength surface plasmon laser according to another exemplary embodiment.

In the embodiment illustrated in FIG. 8, the plurality of regions 122a, 122b, and 122c of the active layer 122 are connected, but the plurality of regions 122a, 122b, and 122c may be separately disposed. For example, FIG. 9 is a cross-sectional front view schematically showing a structure of a multi-wavelength surface plasmon laser 600 according to another embodiment. Referring to FIG. 9, the active layer 122 may include a plurality of regions 122a, 122b, and 122c that are disposed separately. The plurality of regions 122a, 122b, and 122c have thicknesses different from one another, and may be disposed to be spaced apart from one or more respective neighboring regions 122a, 122b, and 122c.

Also, as illustrated in FIG. 9, the plurality of regions 122a, 122b, and 122c may include a plurality of quantum dots 125, 126, and 127 whose diameters are different from one another. The quantum dots 125, 126, and 127 are particles that have sizes to produce a quantum confinement effect, and may be formed of a compound semiconductor, for example, cadmium telluride (CdTe), cadmium selenide (CdSe), zinc sulfide (ZnS), cadmium sulfide (CdS), and the like. The wavelengths of lights emitted from the quantum dots 125, 126, and 127 vary with the diameters of quantum dots 125, 126, and 127. In order for the plurality of regions 122a, 122b, and 122c of the active layer 122 to emit lights of different wavelengths, the quantum dots 125, 126, and 127 whose diameters are different from one another are disposed for each of the regions 122a, 122b, and 122c. The quantum dots 125, 126, and 127 disposed in one of the regions 122a, 122b, and 122c may substantially have the same diameter. For example, first quantum dots 125 that have a first diameter may be disposed in the first region 122a. Second quantum dots 126 that have a second diameter may be disposed in the second region 122b. Third quantum dots 127 that have a third diameter may be disposed in the third region 122c. In FIG. 9, it is illustrated that the diameters of the quantum dots 125, 126, and 127 gradually decreases along the x-axis. However, this is just an example, and the present embodiment is not limited thereto.

Figure 10:
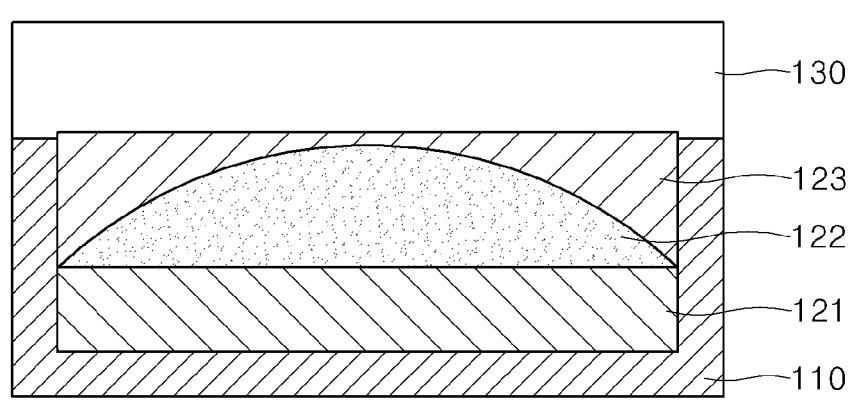
FIG. 10 is a cross-sectional front view schematically showing a structure of a multi-wavelength surface plasmon laser according to another exemplary embodiment.

Meanwhile, the thickness of the active layer 122 may change in a symmetrical manner. For example, FIG. 10 is a cross-sectional front view schematically showing a structure of a multi-wavelength surface plasmon laser 700 according to another embodiment. Referring to FIG. 10, the thickness of the active layer 122 may be symmetrical with respect to the central axis. In other words, the thickness of the active layer 122 may be the biggest at the center and may gradually decrease toward each edge. Alternatively, the thickness of the active layer 122 may be smallest at the center and may gradually increase toward each edge. In this case, the wavelength distribution of surface plasmons released from the multi-wavelength surface plasmon laser 700 also may have a symmetrical shape with respect to the central axis.

Figure 11:
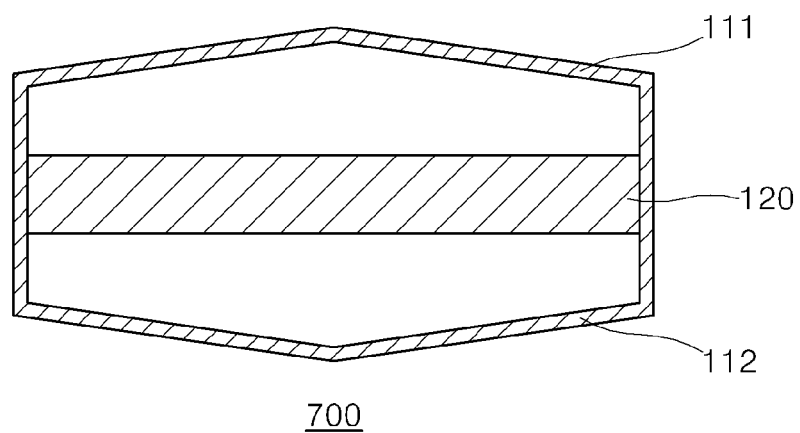
FIG. 11 is a cross-sectional view showing a structure of a resonant cavity of the multi-wavelength surface plasmon laser illustrated in FIG. 10.

FIG. 11 is a cross-sectional view showing a structure of a resonant cavity of the multi-wavelength surface plasmon laser 700 illustrated in FIG. 10. If the thickness of the active layer 122 changes symmetrically, the length of the resonant cavity also may change symmetrically as illustrated in FIG. 11. To obtain a symmetrical change of the length of the resonant cavity, an interval between the first reflector 111 and the second reflector 112 may change symmetrically. For example, the interval between the first reflector 111 and the second reflector 112 may be the highest at the center and may decrease toward each edge. Alternatively, the interval between the first reflector 111 and the second reflector 112 may be the smallest at the center and may gradually increase toward each edge. In FIG. 11, it is illustrated that each of the first reflector 111 and the second reflector 112 has a symmetrical shape, but one of the first reflector 111 and the second reflector 112 may have a flat surface shape, and the other one may have a symmetrical shape. This symmetrical structure may also apply to the embodiments of FIG. 7 through FIG. 9.

Figure 12:
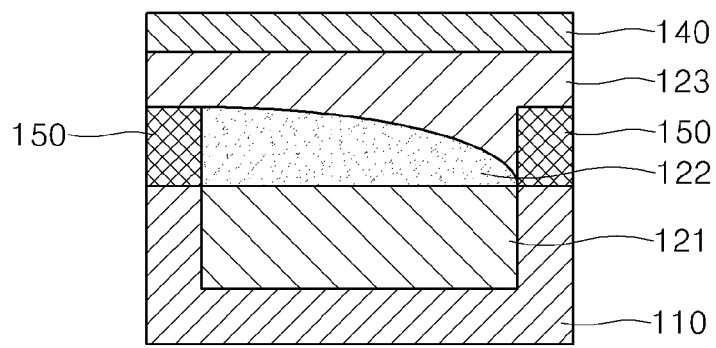
FIG. 12 is a cross-sectional front view schematically showing a structure of a multi-wavelength surface plasmon laser according to another exemplary embodiment.

FIG. 12 is a cross-sectional front view schematically showing a structure of a multi-wavelength surface plasmon laser 800 according to another embodiment. Referring to FIG. 12, the multi-wavelength surface plasmon laser 800 according to the present embodiment may include an electrode layer 140, instead of the cover layer 130, on the second clad layer 123 of the semiconductor layer 120. In this case, the semiconductor layer 120 may be electrically pumped to emit light. In order to prevent the metal layer 110 from electrically contacting the second clad layer 123, an insulating layer 150 may be further disposed at least partly around the second clad layer 123, and a portion of the metal layer 110 may be extended to enclose only a side surface of the first clad layer 121.

In this structure, a voltage may be applied to the metal layer 110 and the electrode layer 140. The first clad layer 121 and the second clad layer 123 may be doped so as to have conductivity for transmitting an electric current to the active layer 122. For example, if a negative voltage is applied to the metal layer 110 and a positive voltage is applied to the electrode layer 140, the first clad layer 121 may be doped with n-type dopants, and the second clad layer 123 may be doped with p-type dopants.

As presented above, exemplary embodiments of the multi-wavelength surface plasmon laser have been described along with the accompanying drawings. It should be understood that the exemplary embodiments should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the exemplary embodiments as defined by the following claims.

What is claimed is:

1. A surface plasmon laser comprising:
   a metal layer;
   a semiconductor layer that is disposed on an upper surface of the metal layer and includes an active layer whose thickness changes along a first direction which is parallel to the upper surface of the metal layer; and
   a first reflector and a second reflector that protrude from the upper surface of the metal layer, are extended from the upper surface of the metal layer, and are respectively disposed opposite a front and a back of the semiconductor layer,
   wherein the first reflector and the second reflector form a resonant cavity for surface plasmons generated at an interface between the metal layer and the semiconductor layer, and a length of a resonant cavity changes along the first direction.

2. The surface plasmon laser of claim 1, wherein the length of the resonant cavity changes with the thickness change of the active layer along the first direction.

3. The surface plasmon laser of claim 1, wherein the length of the resonant cavity is determined by an interval between the first reflector and the second reflector along a second direction which is perpendicular to the first direction, and
   wherein the interval between the first reflector and the second reflector changes along the first direction.

4. The surface plasmon laser of claim 1, wherein the thickness of the active layer continuously changes along the first direction.

5. The surface plasmon laser of claim 1, wherein the thickness of the active layer discretely changes in a plurality of step portions along the first direction.

6. The surface plasmon laser of claim 1, wherein the active layer comprises a plurality of regions whose thicknesses are different from each other and are spaced apart from each other.

7. The surface plasmon laser of claim 6, wherein each of the plurality of regions of the active layer has a plurality of quantum dots, a plurality of diameters of the quantum dots disposed in each respective region are substantially equal, and the diameters of the quantum dots disposed in each respective region are different from a plurality of diameters of quantum dots disposed in other regions of the regions.

8. The surface plasmon laser of claim 1, wherein the thickness of the active layer and the length of the resonant cavity changes symmetrically.

9. The surface plasmon laser of claim 1, wherein the semiconductor layer comprises:
   a first clad layer disposed on the metal layer;
   the active layer disposed on the first clad layer; and
   a second clad layer disposed on the active layer.

10. The surface plasmon laser of claim 9, wherein at least a portion of the first clad layer is buried in the metal layer.

11. The surface plasmon laser of claim 9, further comprising:
    an electrode layer disposed on the second clad layer, and
    an insulating layer disposed at least partially around the second clad layer to prevent the metal layer from electrically contacting the second clad layer.

12. The surface plasmon laser of claim 1, wherein the length of the resonant cavity continuously changes along the first direction.

13. The surface plasmon laser of claim 12, wherein the first reflector and the second reflector form a flat surface, and the first reflector and the second reflector are not parallel to each other so that an interval between the first reflector and the second reflector continuously changes.

14. The surface plasmon laser of claim 13, wherein at least one of the first reflector and the second reflector is disposed in a slant toward the front or the back of the semiconductor layer.

15. The surface plasmon laser of claim 1, wherein the length of the resonant cavity discretely changes in a plurality of step portions along the first direction.

16. The surface plasmon laser of claim 15, wherein at least one of the first reflector and the second reflector has a plurality of bent step portions.

17. The surface plasmon laser of claim 1, wherein at least one of the first reflector and the second reflector includes a plurality of vertical reflective films that are parallel to each other.

18. The surface plasmon laser of claim 1, further comprising:
    a transparent cover layer covering the upper surface of the metal layer and the semiconductor layer.

19. An optoelectronic integrated circuit including a surface plasmon laser, wherein the surface plasmon laser comprises:
    a metal layer;
    a semiconductor layer that is disposed on an upper surface of the metal layer and includes an active layer whose thickness changes along a first direction which is parallel to the upper surface of the metal layer; and
    a first reflector and a second reflector that protrude from the upper surface of the metal layer, are extended from the upper surface of the metal layer, and are respectively disposed opposite a front and a back of the semiconductor layer,
    wherein the first reflector and the second reflector form a resonant cavity for surface plasmons generated at an interface between the metal layer and the semiconductor layer, and a length of a resonant cavity changes along the first direction.

* * * * *